United States Patent
Eckert et al.

(10) Patent No.: US 10,347,337 B2
(45) Date of Patent: *Jul. 9, 2019

(54) CONTENT ADDRESSABLE MEMORY WITH MATCH HIT QUALITY INDICATION

(71) Applicant: INTERNATIONAL BUSINESS MACHINES CORPORATION, Armonk, NY (US)

(72) Inventors: Martin Eckert, Moetzingen (DE); Alexander Fritsch, Esslingen (DE)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/834,221

(22) Filed: Dec. 7, 2017

(65) Prior Publication Data

US 2018/0204618 A1 Jul. 19, 2018

Related U.S. Application Data

(63) Continuation of application No. 15/406,866, filed on Jan. 16, 2017, now Pat. No. 9,892,789.

(51) Int. Cl.
*G11C 15/00* (2006.01)
*G11C 15/04* (2006.01)
(Continued)

(52) U.S. Cl.
CPC .............. *G11C 15/04* (2013.01); *G11C 29/26* (2013.01); *G11C 29/34* (2013.01); *G11C 29/38* (2013.01); *G11C 29/44* (2013.01); *G11C 2029/1804* (2013.01)

(58) Field of Classification Search
CPC ....... G11C 15/04; G11C 15/00; G11C 15/043; G11C 13/0002; G11C 15/046;
(Continued)

(56) References Cited

U.S. PATENT DOCUMENTS

| 5,051,947 A | 9/1991 | Messenger et al. |
| 5,448,733 A | 9/1995 | Satoh et al. |

(Continued)

FOREIGN PATENT DOCUMENTS

| JP | 2010-170461 A | 8/2010 |
| WO | WO 2014/038306 A1 | 3/2014 |
| WO | WO 2015/025467 A1 | 2/2015 |

OTHER PUBLICATIONS

Shinde et al., "Similarity Search and Locality Sensitive Hashing Using Ternary Content Addressable Memories", Special Interest Group on Management of Data (SIGMOD) Conference, Indianapolis, Indiana, Jun. 6-11, 2010 (pp. 375-386).

(Continued)

*Primary Examiner* — Thong Q Le
(74) *Attorney, Agent, or Firm* — Margaret McNamara, Esq.; Kevin P. Radigan, Esq.; Heslin Rothenberg Farley & Mesiti P.C.

(57) ABSTRACT

A logic circuit is provided including at least two input cells and a sense circuit. The input cells are connected to a common result line. Further, the input cells are operable for influencing an electrical quantity at the result line. The sense circuit is connected to the result line, and is adapted to output a discrete value out of more than two possible values based on the electrical quantity.

18 Claims, 3 Drawing Sheets

(51) Int. Cl.
  *G11C 29/26* (2006.01)
  *G11C 29/34* (2006.01)
  *G11C 29/38* (2006.01)
  *G11C 29/44* (2006.01)
  *G11C 29/18* (2006.01)

(58) Field of Classification Search
  CPC ....... G11C 29/26; G11C 29/38; G11C 29/816;
          G11C 2029/0405; G11C 2029/1804;
                    G11C 2029/2602
  USPC ........ 365/49.17, 49.1, 49.15, 154, 156, 203,
          365/49.16, 189.07, 201, 49.11, 200, 207,
                     365/225.7, 233.1, 49.18
  See application file for complete search history.

(56) References Cited

U.S. PATENT DOCUMENTS

| | | | |
|---|---|---|---|
| 8,065,293 B2 | 11/2011 | Mukerjee et al. | |
| 8,219,550 B2 | 7/2012 | Merz et al. | |
| 8,301,604 B1 | 10/2012 | Anker et al. | |
| 9,292,508 B2 | 3/2016 | Satoh | |
| 9,892,789 B1* | 2/2018 | Eckert | G11C 15/04 |
| 2012/0206951 A1* | 8/2012 | Rachamadugu | G11C 15/04 |
| | | | 365/49.17 |
| 2013/0326111 A1 | 12/2013 | Arsovski et al. | |
| 2014/0156263 A1 | 6/2014 | Maguire | |
| 2015/0248936 A1 | 9/2015 | Best et al. | |

OTHER PUBLICATIONS

Fernandez, Edward, "Hardware Implementation of a String Matching Algorithm Based on the FM-Index", UC Riverside Electronic Theses and Dissertations, 2010 (132 pages).

Eckert et al., "Content Addressable Memory with Match Hit Quality Indication", U.S. Appl. No. 15/406,866, filed Jan. 16, 2017 (23 pages).

Eckert et al., "List of IBM Patents and Patent Applications Treated as Related", U.S. Appl. No. 15/834,221, filed Dec. 7, 2017, dated Dec. 7, 2017 (2 pages).

* cited by examiner

US 10,347,337 B2

CONTENT ADDRESSABLE MEMORY WITH MATCH HIT QUALITY INDICATION

BACKGROUND

The invention relates to a logic circuit.

Many applications require determining if a test word having of n bits matches a reference word having of the same number of bits. For this purpose, the i-th bit of the test word may be connected to a first input of an i-th XOR-gate and the i-th bit of the reference word may be connected to a second input of the i-th XOR-gate and the outputs of the XOR-gates may be coupled through AND-gates resulting in a single bit, which indicates whether the test word matches the reference word. A partial match will result in a mismatch. This comparison may be performed within a single cycle.

However, depending on the application it may be desirable to have an indication of the extent the test word matches the reference word. This may be called a match quality indication. For example, if fifty percent of the bits of the test word are identical to the reference word, producing the indication may require changing every combination of bits of the reference word one after the other and comparing the resulting reference words with the test bits. Accordingly, it is very time consuming. Hence, there may be a need for a faster quality indication approach.

SUMMARY

In accordance with one or more aspects, a logic circuit is provided, including at least two input cells and a sense circuit. The input cells are connected to a common result line and are operable for influencing an electrical quantity at the common result line based on identified match results at the respective input cells. The sense circuit is connected to the result line and is adapted to output a discrete value out of more than two possible values based on the electrical quantity, and therefore, based on the match results identified by the input cells.

In one embodiment of the logic circuit, the sense circuit is adapted to insulate the result line from a supply voltage. This may reduce power consumption of the logic circuit.

A further embodiment of the logic circuit includes the sense circuit having at least two sensing elements, wherein each sensing element is configured for comparing the electrical quantity with a different predefined threshold, and wherein each sensing element includes a logic output for providing the result of the comparison as a one bit signal. Providing the result of the comparison as one bit signals may facilitate further processing of the result.

In another embodiment of the logic circuit, the sense circuit includes an encoder adapted for determining an encoded representation, in particular a binary encoded representation, from the one bit signals. An encoded representation may require fewer connections to transmit the result for further processing and/or less memory cells for temporarily storing the result.

Additionally, an embodiment of the logic circuit includes that each sensing element having a switch, such as a power header, for insulating the sensing element from the supply voltage. Insulating the sensing elements from the supply voltage may reduce power consumption in case the respective sensing element is not required. Moreover, the combination of the switches of the sensing elements may allow for insulating the result line from the supply voltage; and may allow for adjustment of quality resolution.

A further embodiment of the logic circuit includes the input cells being content addressable memory cells (CAM cells). The result line is the match line of the CAM cells and each CAM cell includes a storage element for storing a reference bit, an input for receiving a test bit and a complementary input for receiving the complementary test bit. The electrical quantity is indicative of a level of similarity between test bits received by the CAM cells and the respective reference bits.

In another embodiment of the logic circuit, the storage element is an SRAM-cell.

Additionally, an embodiment of the logic circuit may have the storage element be a DRAM-cell.

A further embodiment of the logic circuit includes the electrical quantity being a current caused by the input cells and flowing through the result line and that the sense circuit is configured for outputting the discrete values based on the result line current.

In another embodiment of the logic circuit, the sense circuit includes at least two sensing elements, wherein each sensing element is configured for comparing the result line current with a different predefined threshold, and wherein each sensing element includes a logic output for providing the result of the comparison as a one bit signal.

Additionally an embodiment of the logic circuit has at least one of the sensing elements including a switch element for insulating the sensing element from the supply voltage.

According to a further embodiment of the logic circuit, at least one of the sensing elements includes a standby PFET, a standby NFET, a current providing PFET, a signaling PFET and a signaling NFET. The source of the standby PFET is connected to a switch element for insulating the sensing element from the supply voltage or directly to the supply voltage. The drain of the standby PFET is connected to the drain of the standby NFET. The source of the standby NFET is connected to the result line. The source of the current providing PFET is connected to the source of the standby PFET. The drain of the current providing PFET is connected to the result line. The source of the signaling PFET is connected to the source of the standby PFET. The drain of the signaling PFET is connected to the drain of the signaling NFET. The drain of the signaling NFET is connected to ground. The gate of the standby PFET is connected to a PFET bias voltage. The gate of the current providing PFET and the gate of the signaling PFET are connected to the drain of the standby PFET. The gate of the standby NFET is connected to a reference voltage. The gate of the signaling NFET is connected to an NFET bias voltage. The drain of the signaling PFET is connected to the logic output for providing the result of the comparison as a one bit signal. Such a sensing element may be implemented in an area efficient way.

In another embodiment of the logic circuit, the predefined threshold depends on the saturation current of the standby PFET.

Further, an embodiment of the logic circuit includes the current providing PFET and the signaling PFET having the same physical properties. Accordingly, the PFETs may more reliably become conductive at the same gate voltage, which may improve timely providing the result to the logic output. Furthermore, it may facilitate the hardware implementation of the logic circuit.

In an additional embodiment of the logic circuit, the sense circuit includes a first sensing element including a first standby PFET and a second sensing element including a second standby PFET, wherein, if the same PFET bias voltage is applied to the gate of the first standby PFET and the gate of the second standby PFET, the ratio of the saturation current of the first standby PFET and the saturation current of the second standby PFET is independent from the PFET bias voltage. This may allow for a particular simple adaptation of the sense circuit to the current, with which a single CAM cell tries to pull down the match line.

In a further embodiment of the logic circuit, the second sensing element includes a second current providing PFET and the predefined threshold of the second sensing element depends on the saturation current of the first standby PFET, the saturation current of the first current providing PFET and the saturation current of the second standby PFET.

In another embodiment of the logic circuit, the gate of the first standby PFET is connected to the gate of the second standby PFET.

In a still further embodiment of the logic circuit, the sense circuit includes an idle NFET, wherein the drain of the idle NFET is connected to the result line, wherein the source of the idle NFET is connected to ground, and wherein the gate of the idle NFET is connected to the NFET bias voltage. This may ensure that the result line is always at a well-defined voltage potential.

Additional features and advantages are realized through the techniques described herein. Other embodiments and aspects are described in detail herein and are considered a part of the claimed aspects.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following details description taken in conjunction with the accompanying drawings in which:

DETAILED DESCRIPTION

Figure 1:
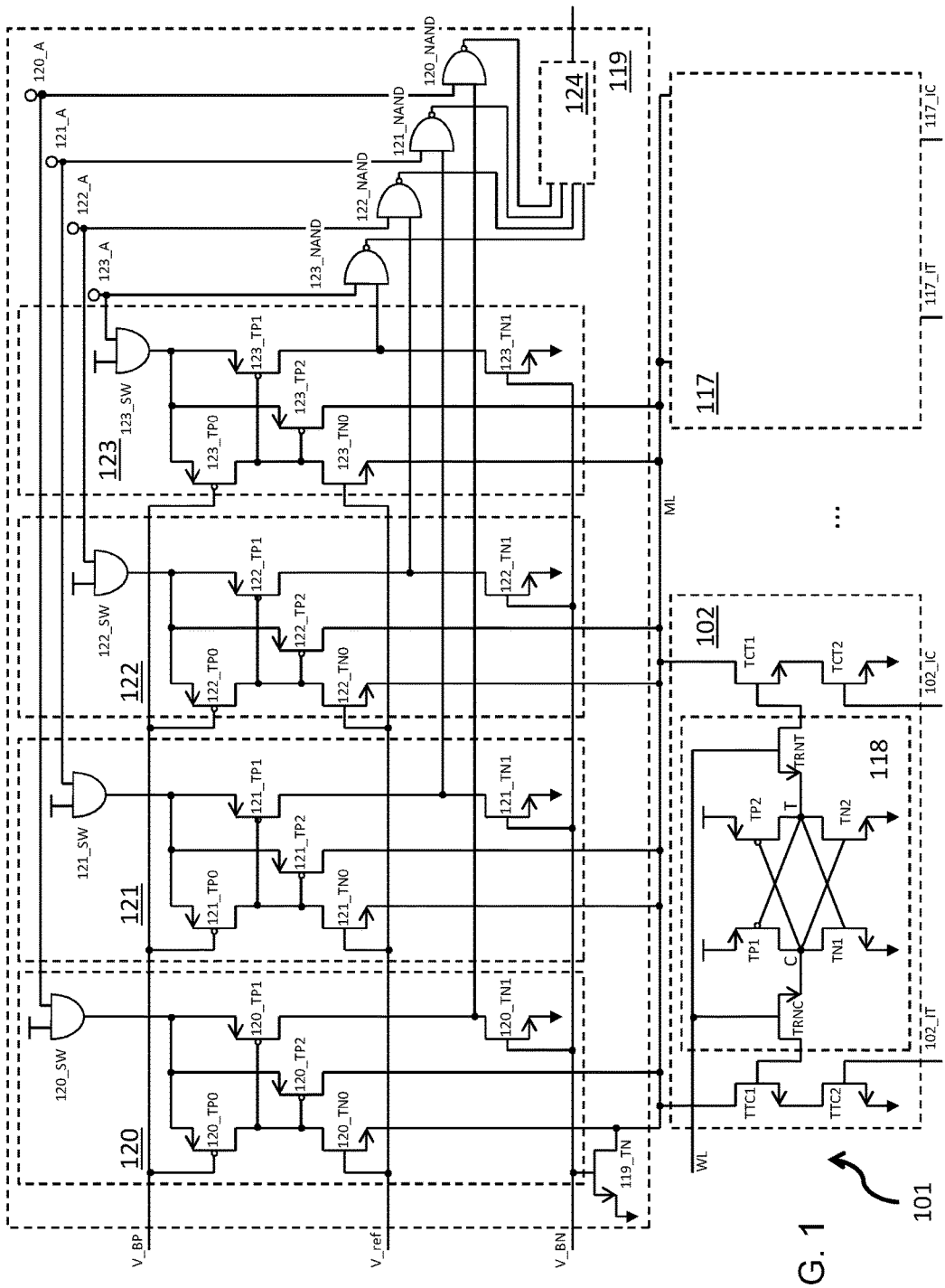
FIG. 1 shows a logic circuit, in accordance with one or more aspects of the present invention.

FIG. 1 discloses a CAM array 101 as an example of a logic circuit, in accordance with one or more aspects of the present invention. The CAM array includes sixteen CAM cells 102 to 117 as input cells. The CAM cells 102 to 117 are connected to common result line, the match line ML. The input cells are operable for influencing an electrical quantity at the result line as will be described hereinafter.

The input cells of the logic circuit may all have the same layout. If the input cells are CAM cells, they may have all the same layout as the CAM cell 102, for example. Accordingly, only the CAM cell 102 will be described in detail. The CAM cell 102 includes a storage element for storing a reference bit. In the embodiment shown in FIG. 1 the storage element is an SRAM cell 118, more particularly 6T-SRAM cell. However, it is also conceivable to use another storage element, such as a latch or a DRAM cell.

Depending on the value of the reference bit, the true node T is either at a high potential or a low potential and, the complementary node C is at a low potential or a high potential, respectively. The reference bit of the CAM cell 102 may be compared with a bit provided in true and complementary form at true input 102_IT and complementary input 102_IC.

The CAM cell 102 may be addressed using the word line WL. In case the true node T and the complementary input 102_IC are at a high potential, the transistors TCT1 and TCT2 will both become conductive and the match line ML will be pulled to ground. If the true node T and the complementary input 102_IC are at low potential, the corresponding complementary node C and true input 102_IT will be at low potential and the transistors TTC1 and TTC2 will both become conductive and the match line ML will be pulled to ground. If the true node T is at a low (high) potential and the true input 102_IT at a high (low) potential, the complementary node C will be at a high (low) potential and the complementary input 102_IC at a low (high) potential. Accordingly, the transistors TTC1 (TCT1) and TTC2 (TCT2) will become insulating and disconnect the match line from ground. Hence, the match line will only be pulled to ground in case the bit to be compared differs from the bit stored in the SRAM cell 118. Pulling to ground may be considered as influencing an electrical quantity at the result line. In an alternative embodiment, source and drain of the transistors TCT1, TCT2, TTC1 and TTC2 could be inverted and the match line could be raised to a match line voltage in case the test bit differs from the reference bit. In a still further embodiment, the electrical quantity could be changed only in case the reference bit is identical to the test bit. This could be achieved, for example, by using the complement input 102_IC as a true input and the true input 102_IT as a complement input for the test bit.

The current I_miss1 which flows from the match line ML through one CAM cell 102 in case of differing test bit and reference bit, i.e. in case of a mismatch, may amount to less than 100 µA, in particular less than 50 µA. In 14 nm technology the current may for example be approximately 30 µA. The match line current I_ML which flows through the match line ML may be essentially the product of the number of mismatch bits and the current I_miss1.

A sense circuit 119 is provided for evaluating the electrical quantity at the result line, i.e. the match line current I_ML. The sense circuit 119 may also be called a match line current sense amplifier. In the embodiment shown in FIG. 1, the sense circuit 119 includes four sensing elements 120 to 123 having a very similar design. The sense circuit 119 may also include more or fewer sensing elements. The sensing elements 120 to 123 may also be referred to as match line current sense amplifier stages 120 to 123.

Each of the four match line current sense amplifier stages 120 to 123 may be activated by applying a high potential to the respective activation inputs 120_A to 123_A. Providing separate activation inputs 120_A to 123_A may allow for a power reduction in case only a limited information concerning the resemblance of the compared word with the stored word is required. For example, in certain applications it may be sufficient to know whether there is any mismatch. In other fields, it may be desirable to know if more than 50% and less than 75% of the bits of the compared words match.

All four sensing elements 120 to 123 of the sense circuit 119 include an activation switch 120_SW to 123_SW for insulating the respective sensing element 120 to 123 from the supply voltage VDD. Thus, the sense circuit 119 is adapted to insulate the result line from the supply voltage. Accordingly, power consumption of the logic circuit may be reduced.

The first match line current sense amplifier stage 120 includes an activation switch 120_SW, a standby PFETs 120_TP0, a signaling PFET 120_TP1 and a current providing PFET 120_TP2 as well as a standby NFET 120_TN0 and a signalling NFET 120_TN1. An NFET bias voltage V_BN is also applied to gate of the NFET 120_TN1 to adjust its operating point. A PFET bias voltage V_BP is applied to the gate of the PFET 120_TP0 to adjust its operating point and a reference voltage V_ref is applied to the gate of the NFET 120_TN0 to adjust its operating point.

The sources of the three PFETs 120_TP0, 120_TP1 and 120_TP2 are all connected to the output of the activation switch 120_SW. The drain of the PFET 120_TP0 is connected to the gates of the PFETs 120_TP1 and 120_TP2 and the drain of the NFET 120_TN0. The sources of the NFET 120_TN0 and the PFET 120_TP1 are connected to the match line ML. The drain of the PFET 120_TP2 is connected to the drain of the NFET 120_TN1. The source of the NFET 120_TN1 is connected to ground.

Depending on the comparison result, the CAM cells 102 and 117 will try to pull the match line to ground. The match line current sense line amplifier 119 will provide a current I_ML to keep the match line at the desired voltage level. The current I_ML will be the same current as the current flowing through the respective CAM-cells 102 and 117 indicating the mismatch. The current I_ML required to keep the match line at the desired voltage level may indicate the amount of matches/mismatches.

The match line current sense line amplifier 119 may include an idle NFET 119_TN. An NFET bias voltage V_BN may be applied to the gate of the idle NFET 119_TN to adjust its operation point. The source of the idle NFET 119_TN is connected to the match line ML and the drain of the idle NFET 119_TN is connected to ground. The NFET bias voltage V_BN is selected to be high enough to ensure that a small current flows from the match line to ground via the idle NFET 119_TN. This may avoid that the match line assuming a potential different from the target potential, in case none of the CAM cells 102 to 117 try to pull the match line to ground. The NFET bias voltage V_BN may be selected to be low enough to ensure that the current through the NFET idle NFET 119_TN is low enough to ensure that the match line current sense line amplifier 119 may detect even a match line current I_ML corresponding to a single mismatch.

For explanation purposes, it may be assumed that only the match line current sense line amplifier stage 120 is activated.

In a first state, the compared word may be identical to the word stored in the CAM cells 102 to 117. Hence, the match line current I_ML will be essentially zero. The bias voltage V_BN is selected such that a small current, which is negligible compared to the current I_miss1, may flow from the match line and the drain of the signaling PFET 120_TP1 to ground. The reference voltage V_ref is selected to render the NFET 120_TN0 conductive. Accordingly, a small current may flow from the output of the switch 120_SW via the PFET 120_TP0, the NFET 120_TN0 and the NFET 119_TN. Hence, the match line ML will assume a potential corresponding to the difference V_ref-V_T of the reference voltage V_ref and the threshold voltage V_T of the NFET 120_TN0. The potential at the gates of the PFETs 120_TP1 and 120_TP2 will be essentially the same as the potential at the output of the switch 120_SW. Hence, both PFETs 120_TP1 and 120_TP2 will be insulating.

In case of a significant match line current induced by at least one conductive CAM cell 102 to 117, i.e., a match line current which surpasses the current through the NFET 119_TN, the match line current sense line amplifier 119 will have to provide a match line current to the match line to compensate for the current from the match line via the respective CAM cell(s) to ground and to keep the match line at the potential V_ref-V_T. The PFET 120_TP0 and the bias voltage V_BP are selected such that, if the match line current surpasses a predefined threshold (for example, a current corresponding to one mismatch I_miss1), the standby PFET 120_TP0 reaches its saturation current. Hence, the potential at the drain of the PFET 120_TP0 will drop. Thus, the PFETs 120_TP1 and 120_TP2 will become conductive. Accordingly, the PFET 120_TP2 will provide the amount of the match line current which surpasses the saturation current I_sat_120_TP0 and the source voltage of the PFET 120_TP1 will assume a high voltage. The drain of the PFET 120_TP1 and the activation input 120_A are both connected to the NAND-gate 120_NAND, which will provide a logic voltage signal at its output indicative of the at least one mismatch.

Typically, the logic circuit is configured such that all match line current sense line amplifier stages 120 to 123 may be activated at the same time and the predefined threshold for the match line current sense line amplifier stage 120 is lower than predefined threshold for the match line current sense line amplifier stage 121, which is lower than the predefined threshold for the match line current sense line amplifier stage 122, etc.

Before the current providing PFET 120_TP2 becomes conductive, the four standby PFETs 120_TP0, 121_TP0, 122_TP0 and 123_TP0 will provide the match line current together. The potential difference between the supply voltage and the match line voltage V_ref-V_T will drop essentially across the standby NFETs 120_TN0, 121_TN0, 122_TN0 and 123_TN0. Accordingly, the match line current will be distributed more or less equally among the four standby PFETs 120_TP0, 121_TP0, 122_TP0 and 123_TP0. The saturation current I_sat_120_TP0 may thus be selected to amount to less than predetermined threshold of the sense element 120 divided by the number of sense element. For example, if the sense element 120 detects a current I_miss1 corresponding to one mismatch and the sense circuit 119 includes four sense elements 120, 121, 122 and 123, then the saturation current I_sat_120_TP0 of the standby PFET 120_TP0 should be selected to amount to less than ¼ of I_miss1.

The saturation current I_sat_120_TP2 of the current providing PFET 120_TP2 is selected such that a match line current I_ML above the predetermined threshold of the sensing element 121 may saturate the standby transistor PFET 121_TP0 of the sensing element 121.

If the predetermined threshold of the sensing element 121 corresponds to a match line current r_121 times the current I_miss1, wherein I_miss1 is the match line current induced by a single conductive CAM cell and r_121 corresponds to the number of conductive CAM cells, the saturation current I_sat_120_TP2 may correspond to I_sat_120_TP2=(r_121−1)*I_miss1-I_sat_120_TP0-I_corr, wherein I_con corresponds to the current flowing through the standby transistors of the sensing elements having a higher predetermined threshold as the sensing element 120 if I_ML=(r_121−1)*I_miss1.

The saturation current I_sat_121_TP0 of the standby transistor 121_TP0 of the sensing element 121 is selected to be larger as the current flowing through the standby transistor if I_ML=(r_121−1)*I_miss1. Moreover, the saturation current I_sat_121_TP0 of the standby transistor 121_TP0 of the sensing element 121 is selected to be below the current corresponding to a single conductive CAM cell I_miss1 divided by the number of sensing elements having a predetermined threshold r_121 or higher.

The saturation current I_sat_121_TP2 of the current providing transistor 121_TP2 is determined in the same way as the saturation current I_sat_120_TP2 of the current providing transistor 120_TP2.

Figure 2:
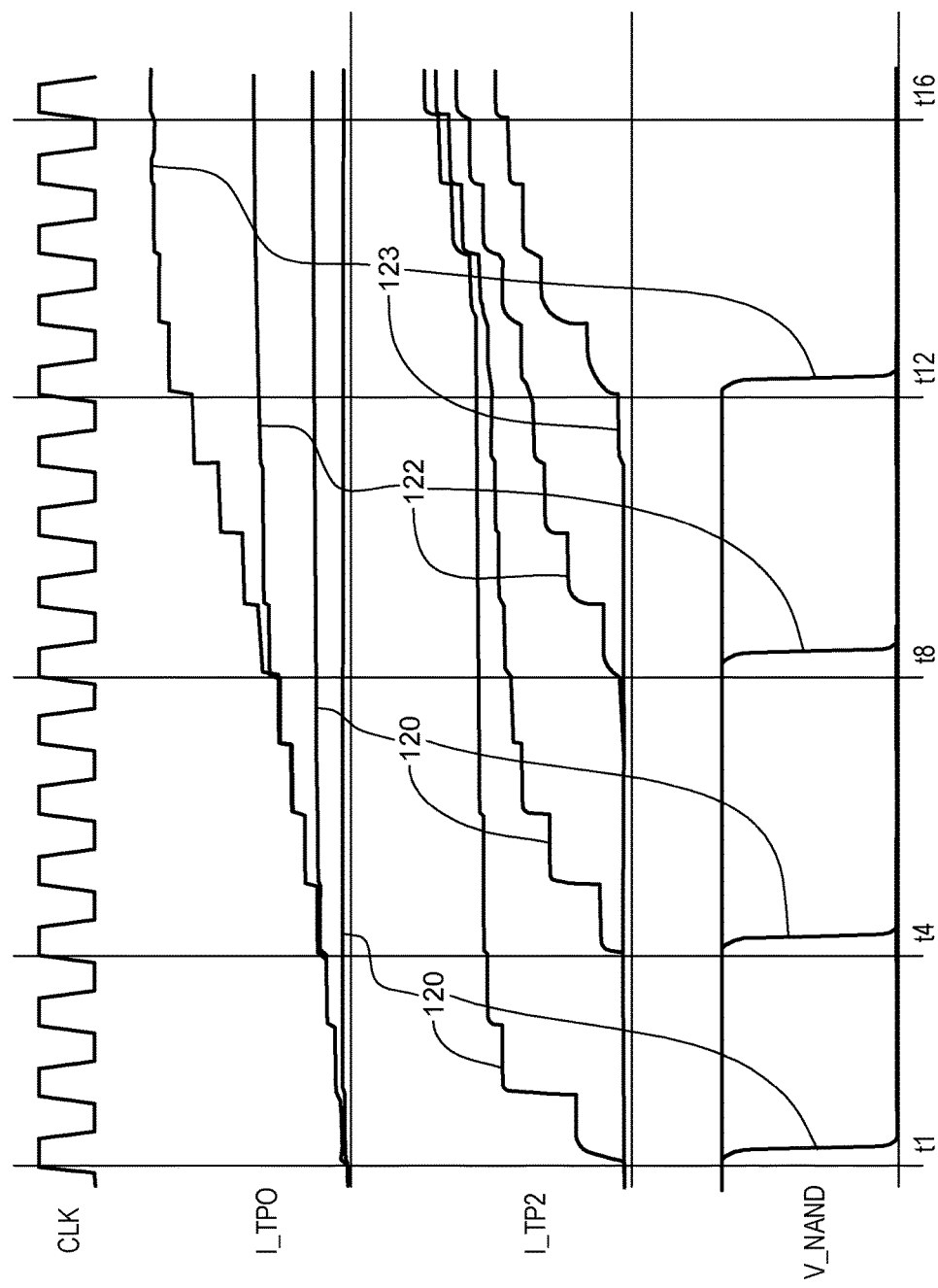
FIG. 2 illustrates simulated currents and voltages of the logic circuit, in accordance with one or more aspects of the present invention.

FIG. 2 is diagram for better understanding the behavior of a sense circuit according to FIG. 1. The uppermost curve shows a clock signal CLK over time. In the beginning the sixteen bit test word completely matches the reference word. After one clock cycle a first bit of the test word is changed, after the next clock cycle a further bit of the test word is changed, etc. In other words, the number of mismatches (and the match line current I_ML) increases with every clock cycle. The second set of curves I_TP0 shows the corresponding current through the standby PFETs 120_TP0, 121_TP0, 122_TP0 and 123_TP0. Moreover, the third set of curves shows the induced current through the current providing PFETs 120_TP2, 121_TP2, 122_TP2 and 123_TP2. The fourth set of curves shows the voltage at the output of the NAND-gates 120_NAND, 121_NAND, 122_NAND and 123_NAND.

The first mismatch leads to a match line current I_ML=I_miss1, which is at first provided by the four standby PFETs 120_TP0, 121_TP0, 122_TP0 and 123_TP0. However, the current I_miss1 saturates the standby transistor 120_TP0. Accordingly, the current through the standby transistors 121_TP0, 122_TP0 and 123_TP0 will be slightly above the current through the standby transistor 120_TP0 (small overshoot at t1). More importantly, due to the saturated standby transistor 120_TP0 the gate voltages of the current providing PFET 120_TP2 and the signaling PFET 120_TP1 increase. Accordingly, a current may flow through the current providing PFET 120_TP0, which may provide the essential part of the match line current I_ML. Thus, the drain of the signaling PFET 120_TP1 will assume a high potential leading to a low voltage at the output of the NAND-gate 120_NAND. Thus, the logic output of the sense circuit 119 indicates one mismatch.

The second mismatch only increases the current through the standby transistors PFET 121_TP0, 122_TP0 and 123_TP0 and the current providing PFET 120_TP2, because the standby PFET 120_TP is already saturated. Most of the current is provided by the current providing PFET 120_TP2. After the third mismatch the current through the current providing PFET 120_TP2 begins to come close to its saturation current. Accordingly, more current has to be provided by the standby PFETs 121_TP0, 122_TP0 and 123_TP0. The fourth mismatch at t=t4 then leads to a saturation of the standby PFET 121_TP0. The current through the standby PFET 121_TP0 no longer increases with further mismatches. Hence, the current providing PFET 121_TP2 and the signaling PFET 121_TP1 become conductive and the voltage at the output of the NAND-gate 121_NAND will assume a low potential.

This behavior of the sense circuit 119 continues until all outputs of the NAND-gates 120_NAND, 121_NAND, 122_NAND and 123_NAND have assumed a low potential at t=t12, i.e. when twelve bits mismatch. Further, the diagram shows that all standby PFETs 120_TP0, 121_TP0, 122_TP0, 123_TP0 and all current providing PFETs 120_TP2, 121_TP2, 122_TP2 and 123_TP2 reach its saturation current in case of sixteen mismatches. This may effectively limit the match line current to avoid any over current, which could damage the logic circuit.

Figure 3:
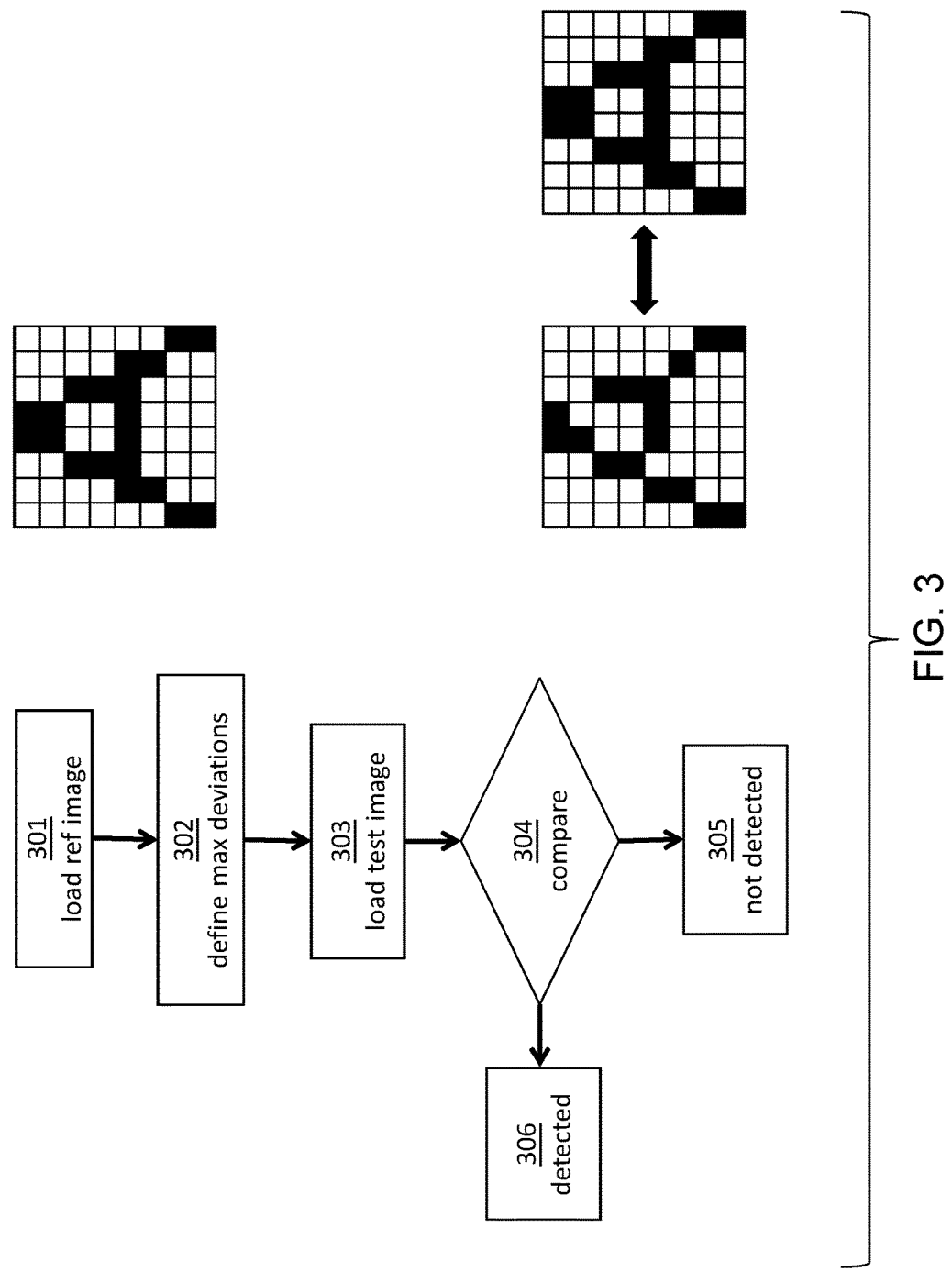
FIG. 3 illustrates an example of use of the logic circuit, in accordance with one or more aspects of the present invention.

FIG. 3 illustrates a possible use of a logic circuit as described hereinbefore for character recognition. In a first step 301, a reference image corresponding to a first letter, e.g., the letter A, is loaded into an array of CAM cells. The first CAM cell may indicate if the first pixel in the first line is black, the second CAM cell may indicate if the second pixel in the first line is black, . . . , the ninth CAM cell may indicate if the first pixel in the second line is black, etc.

In a second step 302 it is determined, how many deviations are allowed between a test image and the reference image to recognize the character. For example, it may be decided that the test image may differ by more than one bit but less than 25% of the bits. Accordingly, the sensing elements indicating one bit difference and 25% bit difference are activated.

In the third step 303, the true and complementary inputs of the CAM array receive the signals corresponding to the black/white value of the pixels of the test image and the test image is compared with the reference image (304).

If it is determined that the test image differs by less than 25% of the pixels, the circuit transmits in step 305 an information that the first letter has been recognized in the test image. If the test image differs by 25% or more of the pixels, the circuit transmits in step 306 an information that the character has not been detected.

The described logic circuit may thus offer the possibility of very fast character recognition.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description, but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:
1. A content addressable memory circuit comprising:
at least two input cells, wherein:
  the input cells are content addressable memory (CAM) cells connected to a common result line, and the CAM cells each comprise:
    a storage element for storing a reference bit;
    an input for receiving a test bit; and
  the input cells are operable for influencing an electrical quantity at the common result line based on identified match results at the respective input cells, the electrical quantity being indicative of a level of similarity between test bits received by the CAM cells and the respective reference bits; and
a sense circuit, wherein:
  the sense circuit is connected to the common result line; and the sense circuit is adapted to output a discrete value out of more than two possible values based on the electrical quantity, and therefore, based on the match results identified by the input cells.

2. The content addressable memory circuit of claim 1, wherein the sense circuit is adapted to insulate the result line from a supply voltage.

3. The content addressable memory circuit of claim 1, wherein:
the sense circuit comprises at least two sensing elements;
each sensing element is configured for comparing the electrical quantity with a different predefined threshold; and
each sensing element comprises a logic output for providing the result of the comparison as a one bit signal.

4. The content addressable memory circuit of claim 3, wherein the sense circuit comprises an encoder adapted for calculating an encoded representation from the one bit signals of the sensing elements.

5. The content addressable memory circuit of claim 3, wherein each sensing element comprises a switch, the switches defining a power header, for insulating the sensing element from the supply voltage.

6. The content addressable memory circuit of claim 1, wherein the CAM cells each comprise a complementary input for receiving the complementary test bit.

7. The content addressable memory circuit of claim 1, wherein the storage element is an SRAM-cell.

8. The content addressable memory circuit of claim 1, wherein the storage element is a DRAM-cell.

9. The content addressable memory circuit of claim 1, wherein:
the electrical quantity is a current caused by the input cells and flowing through the common result line; and
the sense circuit is configured for outputting the discrete values based on the common result line current.

10. The content addressable memory circuit of claim 1, wherein:
the sense circuit comprises at least two sensing elements;
each sensing element is configured for comparing the common result line current with a different predefined threshold; and
each sensing element comprises a logic output for providing the result of the comparison as a one bit signal.

11. The content addressable memory circuit of claim 10, wherein at least one of the sensing elements comprises a switch element for insulating the sensing element from the supply voltage.

12. A logic circuit comprising:
at least two input cells, wherein:
the input cells are connected to a common result line;
the input cells are operable for influencing an electrical quantity at the common result line based on identified match results at the respective input cells;
a sense circuit, wherein:
the sense circuit is connected to the common result line;
the sense circuit is adapted to output a discrete value out of more than two possible values based on the electrical quantity, and therefore, based on the match results identified by the input cells;
wherein;
the input cells are content addressable memory (CAM) cells;
the result line is the match line of the CAM cell;
the CAM cells each comprise:
a storage element for storing a reference bit;
an input for receiving a test bit; and
the electrical quantity is indicative of a level of similarity between test bits received by the CAM cells and the respective reference bits; and
wherein:
the sense circuit comprises at least two sensing elements;
each sensing element is configured for comparing the common result line current with a different predefined threshold;
each sensing element comprises a logic output for providing the result of the comparison as a one bit signal; and
wherein:
at least one of the sensing elements comprises:
a standby PFET;
a standby NFET;
a current providing PFET;
a signaling PFET; and
a signaling NFET;
the source of the standby PFET is connected to a switch element for insulating the sensing element from the supply voltage or directly to the supply voltage;
the drain of the standby PFET is connected to the drain of the standby NFET;
the source of the standby NFET is connected to the result line;
the source of the current providing PFET is connected to the source of the standby PFET;
the drain of the current providing PFET is connected to the result line;
the source of the signaling PFET is connected to the source of the standby PFET;
the drain of the signaling PFET is connected to the drain of the signaling NFET;
the source of the signaling NFET is connected to ground;
the gate of the standby PFET is connected to a PFET bias voltage;
the gate of the current providing PFET and the gate of the signaling PFET are connected to the drain of the standby PFET;
the gate of the standby NFET is connected to a reference voltage;
the gate of the signaling NFET is connected to an NFET bias voltage; and
the drain of the signaling PFET is connected to the logic output for providing the result of the comparison as a one bit signal.

13. The logic circuit of claim 12, wherein the predefined threshold depends on the saturation current of the standby PFET.

14. The logic circuit of claim 12, wherein the current providing PFET and the signaling PFET have the same physical properties.

15. The logic circuit of claim 12,
wherein the sense circuit comprises:
a first sensing element including a first standby PFET; and
a second sensing element including a second standby PFET; and
based on the same PFET bias voltage being applied to the gate of the first standby PFET and the gate of the second standby PFET, the ratio of the saturation current of the first standby PFET and the saturation current of the second standby PFET is independent from the PFET bias voltage.

16. The logic circuit of claim 15, wherein:
the second sensing element includes a second current providing PFET; and
the predefined threshold of the second sensing element depends on the saturation current of the first standby PFET, the saturation current of the first current providing PFET and the saturation current of the second standby PFET.

17. The logic circuit of claim 15, wherein the gate of the first standby PFET is connected to the gate of the second standby PFET.

18. The logic circuit of claim 12, wherein:
the sense circuit comprises an idle NFET;
the drain of the idle NFET is connected to the result line;
the source of the idle NFET is connected to ground; and
the gate of the idle NFET is connected to the NFET bias voltage.

* * * * *